United States Patent
Brown, III et al.

(10) Patent No.: US 6,539,533 B1
(45) Date of Patent: Mar. 25, 2003

(54) TOOL SUITE FOR THE RAPID DEVELOPMENT OF ADVANCED STANDARD CELL LIBRARIES

(75) Inventors: Arnett J. Brown, III, Chapel Hill, NC (US); Robert J. Stalker, Haymarket, VA (US); Rajen Naran Lakhani, Cary, NC (US); Eric Wayne Neiderer, Newtown, PA (US); Devin Bayles, Centreville, VA (US)

(73) Assignee: BAE Systems Information and Electronic Systems Integration, Inc., Nashua, NH (US)

( * ) Notice: Subject to any disclaimer, the term of this patent is extended or adjusted under 35 U.S.C. 154(b) by 206 days.

(21) Appl. No.: 09/597,229

(22) Filed: Jun. 20, 2000

(51) Int. Cl.[7] .............................................. G06F 17/50
(52) U.S. Cl. .............................. 716/17; 716/8; 716/12; 716/13; 716/14
(58) Field of Search ................................ 716/8, 12, 13, 716/14, 9, 10, 17; 326/38, 39; 327/99; 703/1, 14; 707/103; 714/726

(56) References Cited

U.S. PATENT DOCUMENTS

| | | | |
|---|---|---|---|
| 4,849,904 A | * | 7/1989 | Aipperspach et al. ......... 716/17 |
| 5,369,595 A | * | 11/1994 | Gould et al. .................. 716/17 |
| 5,381,343 A | | 1/1995 | Bamji et al. |
| 5,581,474 A | | 12/1996 | Bamji et al. |
| 5,604,680 A | | 2/1997 | Bamji et al. |
| 5,610,831 A | | 3/1997 | Matsumoto |
| 5,666,288 A | * | 9/1997 | Jones et al. .................. 716/17 |
| 5,862,089 A | | 1/1999 | Raad et al. |

* cited by examiner

Primary Examiner—Vuthe Siek
Assistant Examiner—Helen B Rossoshek
(74) Attorney, Agent, or Firm—Swidler Berlin Shereff Friedman, LLP (57) ABSTRACT

A library tool suite supplements conventional design tools to increase the speed, automation and accuracy of creating physical designs for a library of cells to be used in chip designs. The tool suite may include a post operations tool, an audit tool, a custom interface, a setup file and a place and route model preparation utility which interact with the conventional tools and design data to automate and ensure integrity of the physical design process. The tool suit facilitates automatically generating libraries corresponding to an overall cell plan, generating attributes defining strength of connection between possible pin placements within a cell to facilitate routing inter-cell nets through a cell, and auditing cells for errors prior to inclusion in a manufacturing library.

14 Claims, 6 Drawing Sheets

TOOL SUITE FOR THE RAPID DEVELOPMENT OF ADVANCED STANDARD CELL LIBRARIES

FIELD OF THE INVENTION

The present invention relates generally to the field of automated design techniques for electronic circuits and, more particularly, to methods and systems for efficiently generating and checking physical layouts corresponding to libraries of electronic circuit cells.

BACKGROUND OF THE INVENTION

Semiconductor manufacturing technology is constantly changing and advancing to realize smaller feature sizes in manufacturing, thus permitting the manufacture of faster, more dense and power efficient electronic circuits. Semiconductor chips, such as application specific integrated circuit chips ("ASICs") and custom logic chips, such as microprocessors and memories, are designed in this environment of change, often on short design schedules.

In order to utilize the latest changes and advances in semiconductor manufacturing technology for a particular chip design or designs, as well as to realize particular performance goals, such as low power and high-speed performance, the design process may often involve creating entirely new electronic circuits for every circuit on the chip or chips. This is challenging because modem chips are very complex, including millions of transistors and often a mile or more of wire interconnecting the transistors. In view of short design schedules and the complexity of chip designs, there is a substantial need for speed and accuracy during the chip design process and for systems to identify and correct design errors in newly designed electronic circuits prior to manufacturing.

One conventional way to improve the efficiency of the chip design process is through hierarchical design. Most, if not all chip designs include large numbers of groups of electronic circuits that perform an identical function. Therefore, it is convenient to identify these groups and design each group one time as a cell. The identical cells may then be instantiated many times on the chip during the design process to create the chip.

In hierarchical design, the lowest level of the design hierarchy is a cell conventionally called a "leaf cell." The leaf cell is an electronic circuit implementing a particular function which includes only the fundamental circuit elements of the technology such as, for example, transistors, capacitors, inductors, resistors and diodes. Above the leaf cells in the design hierarchy are cells which may include other cells, leaf cells and/or fundamental circuit elements which are interconnected to realize a desired function. At the highest level of the design hierarchy, the entire chip is represented as interconnected cells in a single cell conventionally called a "root cell." The root cell is analogous to the trunk of a tree, where each cell in the root cell is a branch off of the trunk of the tree. Each branch may include several levels of hierarchy between its interface with the trunk and the end of the branch, which is the leaf cell. The set of cells that are present in a chip design is generally referred to as a "library" and the set of leaf cells that are available for implementation in a chip design, are generally referred to as a "macro library" or "cell library."

The chip design process generally includes a logic design process and physical design process. In the logic design process, schematics representing the electronic circuits that comprise individual cells of the chip, as well as the entire chip, are created at each level of the design hierarchy to realize particular functional and performance goals. In the physical design process, the schematics of individual electronic circuits are transformed into the corresponding geometric shapes of mask works that are used in manufacturing the chip. The physical design process generally seeks to take advantage of the latest advances in semiconductor manufacturing technology by using minimum feature sizes to implement circuit elements where appropriate.

The logical and physical design processes are facilitated by the use of design automation tools. Typically, design automation tools run on a computer workstation, such as a UNIX based workstation. For example, during the logical design process, design automation tools called logic synthesis tools allow a chip designer to create schematics for cells at any or all levels of the design hierarchy. In addition, once a cell library representing the available leaf cells has been designed, design automation tools allow designers to automatically create or "synthesize" a schematic for an entire chip, or a substantial portion thereof, from a functional representation of a chip. The logic synthesis tools use the leaf cells of the cell library as building blocks for the chip design.

During the physical design process, design automation tools allow the automatic generation of the geometric shapes of the mask works directly from schematics on a cell-by-cell basis. The latter is typically done in stages. For example, in one stage, a cell schematic is conventionally converted into geometric shapes called "layout" using a layout synthesis tool. The layout synthesis tool takes a cell schematic as input, and outputs a "symbolic layout" for the cell by converting each circuit element, such as a transistor, capacitor, resistor or diode, into predefined geometric shapes or symbols representing a manufacturing plan for the circuit element. The layout synthesis tool also preserves connectivity between the circuit elements represented as symbols in the layout. In a later stage, the symbolic layout of the cell is compacted into a smaller area than it originally occupied, typically based on manufacturing groundrules defined for the desired semiconductor manufacturing technology. The compaction process is designed to increase the density of electronic circuits to the maximum extent permitted by the manufacturing technology.

During a chip design, the creation of the logical and physical designs of the leaf cells or "cell library" is critically important as the macro library forms the basic building blocks for the chip. Once the physical design of the leaf cells is completed, then the physical design of the chip may proceed by placing instances of the leaf cells and other cells into the root cell of the chip and routing wires between the leaf cells as defined by the hierarchy of the root cell schematic. In addition, data generated from the physical design of the leaf cells, such as input pin capacitance, drive strength and delay, are used in chip simulation to verify proper operation and performance and to make final logical design changes in view of the chip simulation.

There are several shortcomings to applying available design automation tools to the task of creating physical designs for a cell library. For example, conventionally, the process of creating layout for individual cells requires substantial manual intervention for each cell. In particular, manual intervention is required to make leaf cells conform to an overall plan for the macro library, such as uniform form factors and power buses and the inclusion of substrate and well contacts in cells. In addition, conventional tools for checking the integrity of the physical design, such as logical to physical and design rule checking tools, are not exhaustive. Thus, conventional processes leave the possibility for flaws in the physical design of the chip.

There is a need for an improved system for automated chip design that allows macro libraries to be generated quickly and directly from leaf cell schematics without substantial manual intervention. There is a further need to apply constraints to design automation tools to facilitate generation of a macro library which conforms to an overall plan. There is still a further need for additional checking of leaf cells to ensure correctness of the physical design of the leaf cell library and, therefore, manufacturability.

SUMMARY OF THE INVENTION

The above described problems and needs associated with automated chip design are addressed with a library tool suite according to embodiments of the present invention. The library tool suite supplements conventional design tools to increase the speed, automation and accuracy of creating physical designs for a library of cells to be used in chip designs. The tool suite may include a post operations tool, an audit tool, a custom interface, a setup file and a place and route model preparation utility which interact with the conventional tools and design data to automate and ensure integrity of the physical design process.

The tool suite facilitates automatically generating libraries corresponding to an overall cell plan, generating attributes defining a strength of connection between possible pin placements within a cell to facilitate routing inter-cell nets through the cell, and auditing cells for errors prior to inclusion in a manufacturing library.

According to one embodiment, a method creates layout for a cell library conforming to an overall plan. The method includes providing a set of design parameters corresponding to a cell. A symbolic layout of the cell is generated based on the design parameters. Constraints are specified on the cell according to an overall plan where the plan includes defining a cell boundary, power bus width and separation. The method further includes generating a compacted layout for the cell from the symbolic layout based on the constraints and generating substrate and well contacts to the compacted layout of the cell. Subsequently, the compacted layout, including the substrate and well contacts, is stored in a database.

In another embodiment of the present invention, the substrate and well contacts may be added based on a position of the cell boundary or based on a position of the power buses in each compacted layout. The constraints may further include at least one form factor constraint specifying a number of power buses per cell when a form factor of the compacted layout meets at least one predetermined condition.

In another embodiment of the present invention, the method may further include converting, identifying, designating and storing. In the converting step, each compacted layout is converted to a geometric layout where the geometric layout includes shapes defining input and output pins and wires connected to the pins. In the identifying step, for each compacted layout, the wires connected to the pins are identified. In the designating step, the wires connected to the pins are designated as weak connections and in the storing step the weak connection designations are stored in the database. The method may further include auditing at least one cell to identify any errors in the geometric layout.

An embodiment of a design automation system according to the present invention includes a memory, a design database and a processor. The memory includes program instructions comprising a compactor tool and a setup file. The setup file defines constraints on the compactor tool including constraints defining a cell boundary, power bus width and separation. The design database stores and retrieves electronic circuit design data and includes at least one symbolic layout corresponding to at least one leaf cell. The processor is coupled to the memory and the design database and executing the program instructions of the compactor tool to: read the setup file and the at least one symbolic layout, compact each of the at least one symbolic layout based on the constraints, and store a compacted layout for each symbolic layout in the database.

In another embodiment of the system, the memory may further include program instructions for a post operations tool. The processor may execute the program instructions for the post operations tool to: identify at least one shapes within the compacted layout, and automatically add substrate and well contacts to the compacted layout based on a position of the at least one identified shape. The at least one identified shape may includes a cell boundary or power buses.

In another embodiment of the present invention, the setup file further comprises at least one form factor constraint specifying a number of power buses per cell when a form factor of the compacted layout meets at least one predetermined condition.

In another embodiment of the invention, the memory further comprises program instructions for a utility and the processor executes the program instructions for the utility to: convert each compacted layout to a geometric layout where the geometric layout includes shapes defining input and output pins and wires connected to the pins, identify for each compacted layout the wires connected to the pins, designate the wires connected to the pins as weak connections, and store the weak connection designations in the database.

In another embodiment of the invention, the memory further comprises program instructions for an audit program and the processor executes the program instructions for the audit program to audit at least one cell to identify any errors in the geometric layout.

In another embodiment of the invention, a method of defining a cell to a routing tool comprises providing, determining, generating and storing. In the providing, a cell abstract is provided. The cell abstract includes design parameters describing the cell to a placement and wiring tool. The design parameters including net definitions. In the determining, at least two potential pin placements are determined along each of at least some of the nets. In the generating, an attribute for a pair of potential pin placements on the same net is generated. The attribute itself represents a strength of connection between the pair along the net. The storing includes storing the attribute for the pair in a database as associated with the cell.

A method of auditing a cell prior to including the cell in a library includes providing design parameters corresponding to a cell. Then determining: whether a cell boundary parameter of the cell is positioned correctly relative to an origin; whether more than one cell boundary exists; and determining a placement of other design parameters relative to the cell boundary. The method then indicates whether an error in the cell has been determined so that errors may be automatically identified and then corrected prior to inclusion in a library.

DETAILED DESCRIPTION

Figure 1:
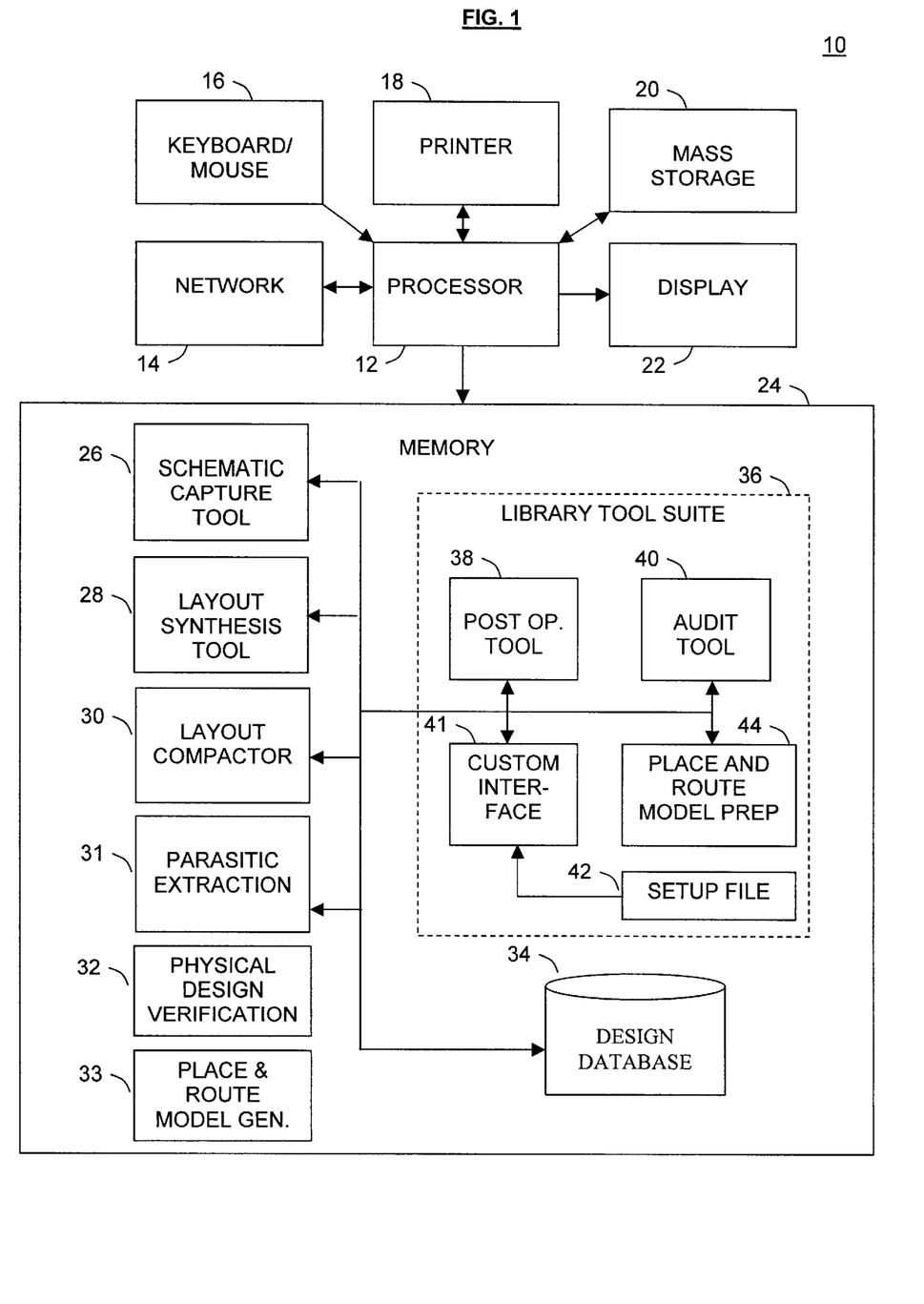
FIG. 1 depicts an embodiment of a system for performing automated design of an electronic circuit, such as an integrated circuit chip, according to the present invention.
Figure 2A:
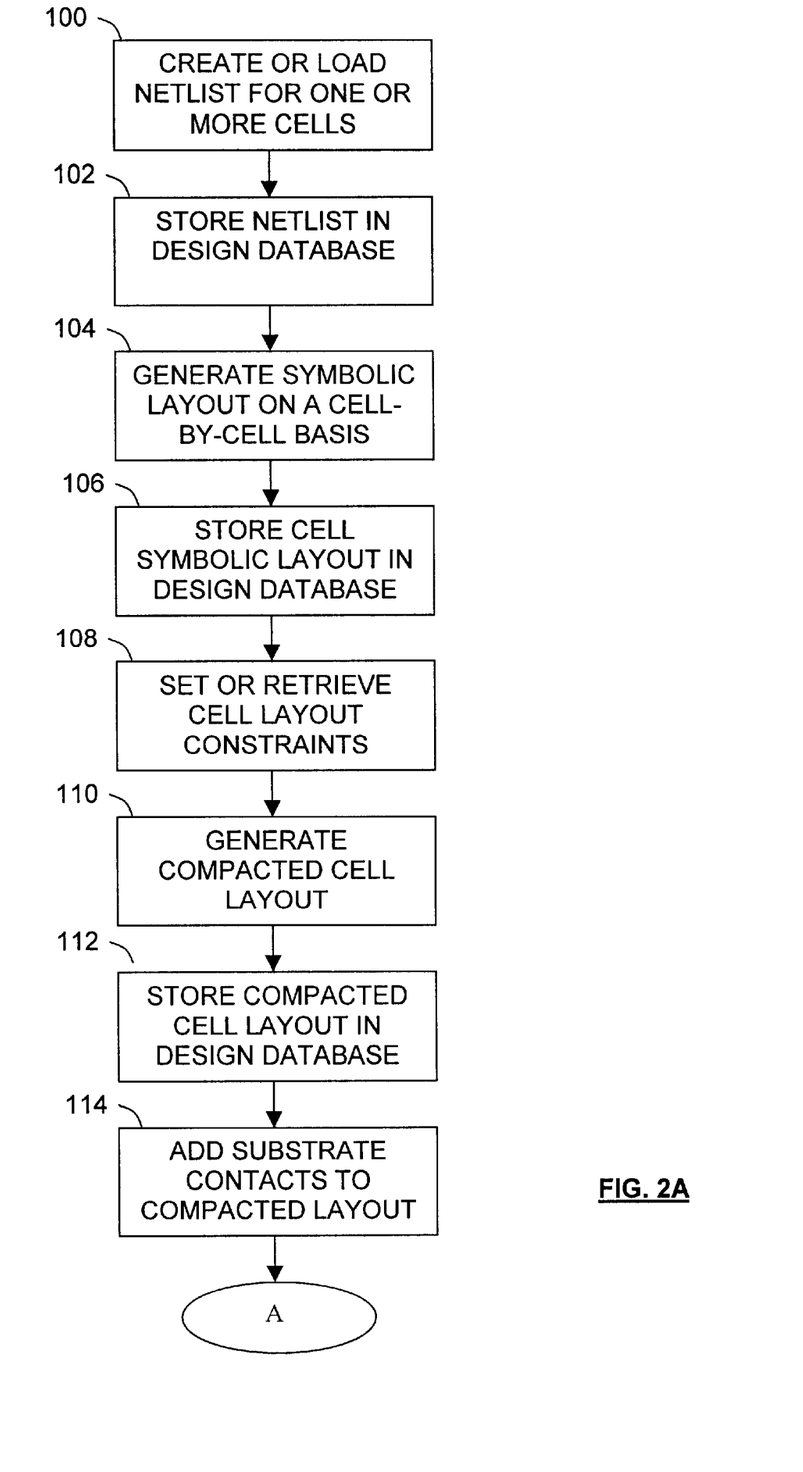
FIGS. 2A–2D depict an embodiment of a method of designing an electronic circuit, such as an integrated circuit chip, according to the present invention.
Figure 2B:
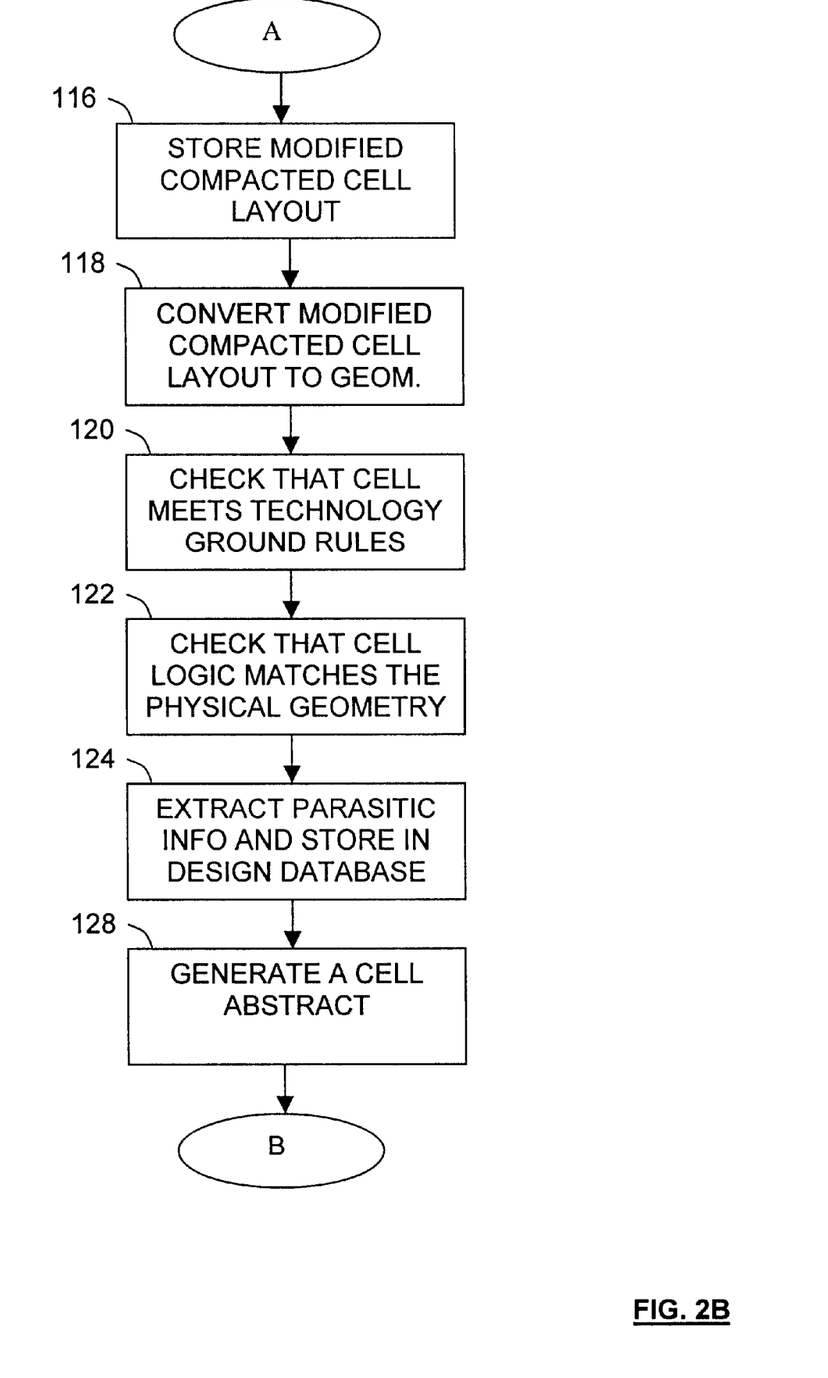
Figure 2C:
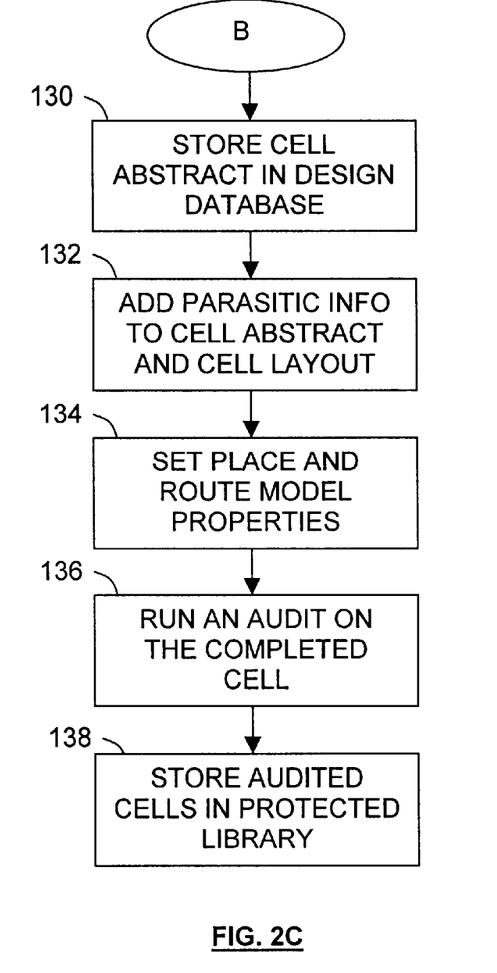
Figure 2D:
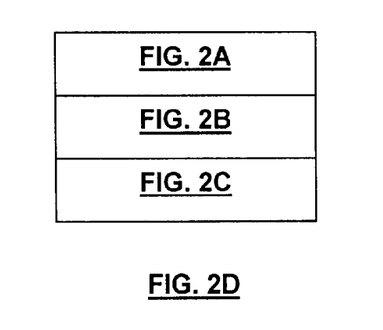

FIG. 1 depicts a system 10 for performing automated design of an electronic circuit, such as an integrated circuit chip. The system 10 includes a processor 12, coupled to a network 14, input devices 16, a printer 18, a mass storage device 20, a display 22 and a memory 24.

The memory 24 may include random access memory (RAM) and/or read only memory (ROM) and other storage devices for storing information on and reading information from a computer useable medium. The other storage devices may illustratively include hard and floppy disk drives, tape drive and compact disk (CD) ROM and video disk drives. The memory 24 stores program instructions for commanding the processor 12 of the system 10 to perform design functions. For example, the memory 24 includes program instructions for a schematic capture tool 26, a layout synthesis tool 28, a layout compactor tool 30, a parasitic extraction tool 31, a physical design verification tool 32, a place and route model generation tool 33 and a design database 34. The database stores design parameters relating to the design of cells. The design parameters may include schematic capture data, such as a netlist including names of devices, pins, which are input/output ports, for each device, and interconnections called "nets" between the pins of the devices; layout data such as coordinates or vectors representing shapes and names of manufacturing levels on which those shapes appear; technology groundrule data specifying, for example, minimum dimensions and space between certain shapes; data sufficient to draw device symbols; and dimensional other data representing constraints. It will be understood, however, that the database 34 may be stored in any convenient location, including in a server on the network 14 and in the mass storage device 20. The tools 26–32 and the design database 34 are conventional and part of the prior art.

According to the present invention, the memory 24 further includes a library tool suite 36 in addition to the design tools 26–32 to increase the speed, automation, functionality and accuracy of library design. The tool suite 36 is not conventionally implemented in the prior art. The tool suite 36 includes a post operations tool 38, an audit tool 40, a custom interface 41, a setup file 42 and a place and route model preparation utility 44. The inventive tool suite 36 interacts with the conventional tools 26–32 and the design database 34 to facilitate design. Program instructions for the tools and data for the database 34 may be uploaded to the memory 24 through a computer usable medium, such as a floppy or CD ROM disk or via the network 14.

During operation of the system 10, the processor 12 retrieves program instructions from the memory 24 and executes the program instructions to carry out design functions and interact with the other components and a user of the system 10. For example, a user may provide input to the design process via the input devices 16, coupled to the processor 12, and the custom interface 41. The input devices may include a mouse, a light pen or other position sensing devices, a keyboard, a microphone or any other convenient input device. The processor 12 receives input from the input devices 16 and processes the input according to the program instructions being executed.

The printer 18 and display 22 are output devices to which the processor may send data to facilitate interactive design between a user and the system 10. The printer 18 may be a printer or a plotter. The processor 12 may send data to the printer 18, generally in response to a user request, to create a hardcopy of an aspect of the design, such as a logical or physical view of a cell. The processor 12 may send data to the display 22 to facilitate interaction with a user as well as to display an aspect of the design, such as a logical or physical view of a cell. The program instructions stored in the memory 24 generally include instructions for providing a graphical user interface on the display 22. The graphical user interface typically includes pull down menus for displaying entries in the database 34 and for facilitating entry of commands by a user either through an interface associated with one of the tools 26–32 or through the custom interface 41.

The network 14 is digital or analog computer and/or telecommunications network arranged in a local area network (LAN) or a wide area network (WAN) configuration. The network 14 may include a plurality of interconnected servers or telecommunications switches. The interconnection may be accomplished in any convenient manner including by electric, optic, or wireless transmission over one or more communications channels. The data network may also be the plurality of interconnected servers, routers and backbones collectively called the Internet. Data transmitted over the network 14 may be transmitted pursuant to any convenient network protocol, illustratively including the internet protocol (IP), the hypertext transfer protocol (http), telnet, file transfer protocol (ftp) and the simple mail transfer protocol (SMTP). The network 14 may include program instructions, stored on a server on the network 14, for the software components 26–32 and 36 shown in the memory 24. The network may, in response to an invocation of a component, serve the requested component to the processor 12 for uploading to the memory 24 for execution. Alternatively, the memory 24 may reside on a remote server, which executes the program instructions. In the latter scenario, the processor 12 may interact with the remote server as a slave device to facilitate interaction between a user and the remote server.

The mass storage device 20 is a storage facility for storing design data. The mass storage device may include RAM, ROM, disk drives, tape drives and any other storage facility. Generally, the processor 12 writes design data to the mass storage facility 20 to store and archive large amounts of data such as final chip design data for manufacturing.

The interaction between the tools and databases illustrated in the memory 24 of the system 10 is further described with reference to the flow chart of FIG. 2. FIG. 2 illustrates a method of rapidly creating new physical designs for cells in a cell library according to the present invention. The cell library is then used in subsequent chip designs to form the building blocks for an ASIC or custom logic chip.

Referring to FIG. 2, in step 100, the processor 12 creates or retrieves a netlist for one or more leaf cells that comprise the cell library under development. The netlist is essentially a schematic which defines a list of circuit elements and cells and interconnections between input/output pins of the circuit elements and cells. The processor 12 may create the netlist by executing program instructions comprising the schematic capture tool 26 and interacting with a designer via the input devices 16 and the display 22. The designer may, for example, use the input devices and the display 22 to draw leaf cell schematics. Schematic capture tools that may be used for designing leaf cell schematics are well known and are provided by many manufacturers including: Viewlogic, Cadence, Mentor Graphics, Orcad, and Avant!. Alternatively, leaf cell schematics may already exist in netlist form and may reside, for example, in the mass storage device 20, the database 34 or on the network 14. In the latter scenario, in step 100, the processor may retrieve the netlist for a leaf cell or cells from the mass storage device 20, database 34 or the network 14. In step 102, the processor stores the netlist representation of one or more leaf cells into the design database 34 of the memory 24.

After step 102, the physical design process begins. In step 104, the processor 12 executes program instructions for the layout synthesis tool 28, such as the Cadence LAS tool. The layout synthesis tool 28 generates a symbolic layout for specified cells based on the netlist representation of each specified cell. The leaf cells for layout synthesis may be specified interactively by a designer using the symbolic layout tool. Alternatively, many leaf cell netlists may be specified in a batch file stored in the memory 24.

The layout synthesis tool creates a "symbolic layout" for each leaf cell specified. The layout synthesis tool creates the symbolic layout for each cell by converting each circuit element in the leaf cell netlist, such as a transistor, capacitor, resistor or diode into predefined geometric shapes or symbols representing a manufacturing plan for fabricating the circuit element. The manufacturing plan generally includes shapes on manufacturing levels that define features that are created in or on a semiconductor substrate during manufacturing. The layout synthesis tool also preserves connectivity between the circuit elements represented in the symbolic layout by creating wire shapes to interconnect shapes corresponding to pins or ports of the circuit elements as indicated in the netlist of the leaf cell.

In step 106, the symbolic layout is stored in the design database 34. Then in step 108, cell layout constraints are specified in a setup file 42 by the designer. Alternatively, a pre-existing setup file 42 specifying cell layout constraints may be retrieved for use in step 108. The setup file 42 specifies parameters or constraints that are chosen as part of an overall plan or strategy for creating the cell library. The plan considers that the physical design of each cell must fit within a chip design including other cells. Therefore, the overall plan for the leaf cell layout should seek to maximize the potential for cells to be placed into the root cell of a chip in a physically abutting relationship, in order to maximize density, while preserving the electrical connectivity between the cells. Moreover, the overall plan may include a power bus scheme based on the technology and a wiring scheme which seeks to maximize the wirability of chips. Based on the overall plan, the setup file 42 may illustratively specify the following constraints on the LAS process:

- power and ground bus height;
- power and ground bus separation;
- vertical or horizontal power and ground buses and the level of metallization on which to route the buses;
- cell height and width defined by a place and route boundary;
- the position of the place and route boundary relative to the cell, such as, for example, relative to the power and ground bus and whether any overlap or a gap should exist between particular manufacturing levels, such as the power and ground bus, and the cell boundary;
- the height of wells, such as N type semiconductor wells or P type semiconductor wells, depending on the technology and the position of the wells relative to the place and route boundary;
- multiple contacts for connections to power and ground; and
- wiring grids that are acceptable for routing intra-cell wires on.

If—then—else logical constraints may also be specified in the setup file 42. For example, according to the present invention, a constraint on the aspect ratio may be set such that if an aspect ratio of the place and route boundary is less than a predetermined threshold, then only one row of power and ground buses should be used and symbolic circuit elements should only be created between the power and ground buses. However, if the place and route boundary is greater than a predetermined threshold, then more than one row of power and ground buses may be used with symbolic circuit elements being placed between the power and ground buses of each row created. The aspect ratio constraint is advantageous as it leads to a cell library having leaf cells of similar shapes. This facilitates increasing the density of leaf cells placed on a chip during placement and routing of the leaf cells into the root cell of the chip.

In step 110, the layout compactor tool 30 is invoked to compact the symbolic layout generated by the layout synthesizer 26 into a compacted layout suitable for manufacturing. The layout compactor 30 reads the setup file 42 from the library parameters database 38 and the symbolic layout stored in the design database 34. Based on the setup file 42 and the symbolic layout, the compactor 30 iteratively moves the symbolic devices closer together and in some cases repositions and rewires them in order to reduce the size of the layout. When successive iterations cease to reduce the size of the layout by more than a predetermined threshold, the compactor finishes. In addition to compacting the symbolic layout to reduce it in size, the layout compactor tool 30 also reads the setup file 42 and preserves constraints specified in the setup file 42. For example, the layout compactor 30 moves, expands or contracts the power and ground buses in the symbolic layout to ensure that they have the height, width and separation defined in the setup file 42. The layout compactor tool 30 then routes wires from the power and ground buses to the individual transistors as appropriate to preserve connectivity. Any other constraints specified are also obeyed by the compactor tool where practicable. For example, the layout compactor may determine an aspect ratio before or after compaction and, if the aspect ration is greater than (or less than) a predetermined ratio, the layout compactor may create two rows of power buses and compact the symbolic layout into two rows instead of one. After compaction, in step 112, the compacted layout is stored in the design database 34. In step 114, the processor 12 executes program instructions for the post operations tool 38 stored in the memory 24.

Figure 3:
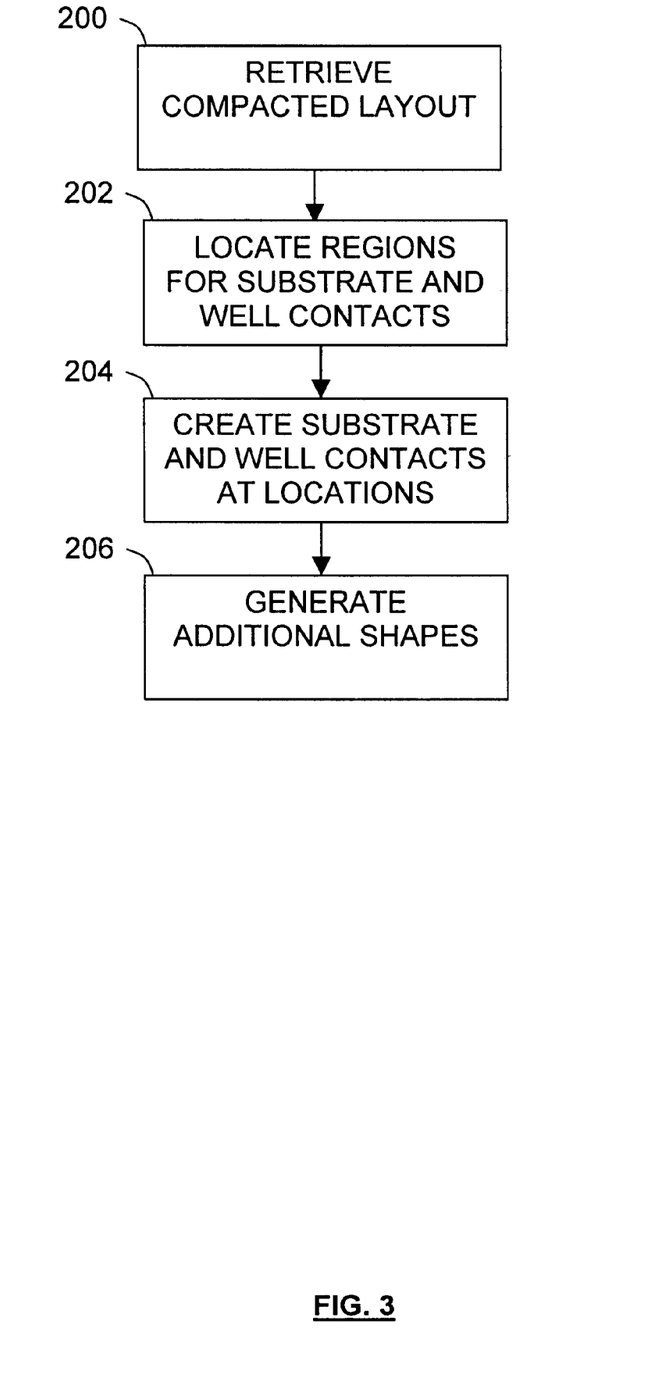
FIG. 3 depicts an embodiment of a method of a post operations tool for automatically adding substrate and well contacts and additional manufacturing features to a compacted library cell layout.

An embodiment of a post operations method, performed by the post operations tool 38, according to the present invention is illustrated in FIG. 3. The method includes automatically adding substrate and well contacts to the compacted layout. This is an improvement over the conventional technique of adding substrate and well contacts manually to the compacted layout on a cell-by-cell basis. Referring to FIG. 3, in step 200, the post operations tool 38 retrieves the compacted layout from the design database 34.

In step 202, the post operations tool 38 locates regions within the compacted layout to place substrate and well contacts. This may be done by, for example, the processor 12 analyzing shapes within the compacted layout to find intersections of shapes on different manufacturing levels. For example, the processor 12 may search for: an intersection of the place and route boundary and the well shape; an intersection of the power or ground bus and the place and route boundary; one edge of the power and/or ground bus; or any other place coincident with or adjacent to which space may exist to accommodate substrate or well contacts.

In step 204, the post operations tool 38 causes the processor 12 to create well and substrate contacts at the locations identified in step 202. The well and substrate contacts typically include a shape defining an implant region surrounding a contact region. The contact region creates an ohmic contact with the implant region and typically, though not necessarily, with a power or ground bus. As part of the overall plan, it may be desirable to create the well and substrate shapes beneath the power buses.

In step 206, the post operations tool 38 causes the processor to generate additional shapes necessary for manufacturing the chip. For example, blocking shapes for N type and P type implants may be generated automatically based on the transistor diffusion shapes in the compacted layout. Typically, the blocking shapes for N type and P type implants are coincident with the diffusion regions of the N or the P type transistors. After step 206 of the post operations method, step 116 begins.

Referring to FIG. 2, in step 116, the processor 12 stores the modified compacted layout in the design database 34. Then in step 118, the processor converts the modified, compacted layout to geometric, not symbolic, shapes on manufacturing levels. In this step, the layout becomes disassociated from the connectivity information inherently included in the symbolic and compacted layouts.

In step 120, the processor 12 checks that the geometric representation of each leaf cell meets technology ground rules. This is a well known process of comparing the geometry in the cell against a set of rules that are designed to determine whether any manufacturing tolerances have been violated. Many tools for performing step 120 are available for performing DRC. These include tools known as DIVA, DRACULA, VAMPIRE, HERCULES and tools available from Mentor Graphics and Synopsis. If any errors are found in step 120, the errors may be stored in the design database 34 for subsequent review by a designer. If no errors are found in the design rule check, then step 122 begins.

In step 122, the processor 12 checks that the logic in the leaf cell netlist matches the devices defined by the physical geometry of the leaf cell. Many commercially available tools are available for performing this logical to physical verification, including a tool available from Cadence known as LVS and tools available from Mentor Graphics and Synopsis. If errors are found in the logical to physical verification, the errors may be stored in the design database 34 for subsequent review and correction by a designer. If no errors are found during the logical to physical checking, then step 124 begins.

In step 124, a parasitic extraction tool 32 is executed by the processor 12. The parasitic extraction tool 32 retrieves the geometric shapes from the geometric layout of the leaf cell stored in the design database 34. Based on the length, width and proximity of shapes in the layout to other shapes, the parasitic extraction tool 32 determines, for example, the parasitic capacitance on each electrical node of leaf cell. The parasitic extraction tool may also extract resistance information based on the conductivity of a material represented by a manufacturing shape and the length and width of the manufacturing shape. A well known tool for extracting parasitic information is called DIVA and is available for purchase from Cadence.

In step 128, the processor 12 generates a cell abstract. The cell abstract describes properties of the cell that characterize the design including, for example, the drive strength of the cell, timing rules, pin locations, the place and route boundary and wiring channels available through the cell. The abstract also includes all of the information necessary to place the cell into another cell and route wires to the pins of the cell, and through the cell, as desired, without interfering with the proper operation of the cell. In step 130, the cell abstract is stored in the design database 34.

Then in step 132, parasitic information, determined in step 124, is added to the cell abstract and the cell layout stored in the database 34. This includes, for example, the sum of parasitic capacitances on input pins of the cell, which facilitates timing and fanout analyses during chip design.

A problem that arises when placing leaf cells into the chip and routing nets between pins of the leaf cells is that conventional place and routing tools may attempt to route inter-leaf cell connections through intra-leaf cell nets. This may pose a problem, however, because intra-leaf cell routing may not be optimized for carrying high current. For example, in a silicon semiconductor design, intra-cell routing may use polysilicon to make a point to point connection from one metal wire to another metal wire or from a pin to a transistor gate. The polysilicon connection is adequate for carrying small currents. However, the same polysilicon connection may not be adequate for carrying larger inter-cell currents on, for example, a net with a large fanout.

It is desirable to depart from conventional techniques and convey to the place and route program information necessary to route inter-cell nets only along strongly connected portions of intracell nets. This is performed in step 134, where the place and route model preparation utility 44 reads specified leaf cells out of the design database 34 and changes the connection properties of nets in the cell abstract to indicate that all intracell nets are weak as opposed to strong connections. Weak connections are those that are established through resistive elements, such as narrow and/or long polysilicon or diffusion wires. Strong connections are those that are established through low resistive elements, such as metal wires. The place and route model preparation utility 44 then identifies possible pin targets along each net. Then with respect to each pair of pin targets on the same net, the place and route model preparation utility changes the weak connection designation to a strong connection designation if the connection between each pair of pin targets is through metal (and contacts) as opposed to through polysilicon, diffusion or other resistive elements. In addition to weak and strong designations, it will be understood that other designations are possible, such as an intermediate strength designation specified based on the resistivity of the interconnection between a pair of pin targets. Intermediate and still other designations may be implemented in some design methodologies according to the present invention in order to maximize the wirability of a chip design.

Once weak and strongly or otherwise connected pin target pairs are identified, this information may be added to the cell abstract as attributes associated with the pin-pairs of the cell. Attributes convey information to users as well as other tools. The weak, strong or other attributes for pin-pairs, as stored in an abstract, may be used during subsequent placing and routing of a leaf cell associated with the abstract into another cell or root cell. For example, the place and route tool may not route inter-cell connections along weak intra-cell nets between potential pin placements having a weak attribute and instead may route inter-cell connections along strong intra-cell nets between any of the potential pin placements having a strong attribute. This obviates problems of logically correct chips failing during operation due to bad routing, avoids the introduction of difficult to detect errors in the design process, and increases wiring flexibility.

Figure 4:
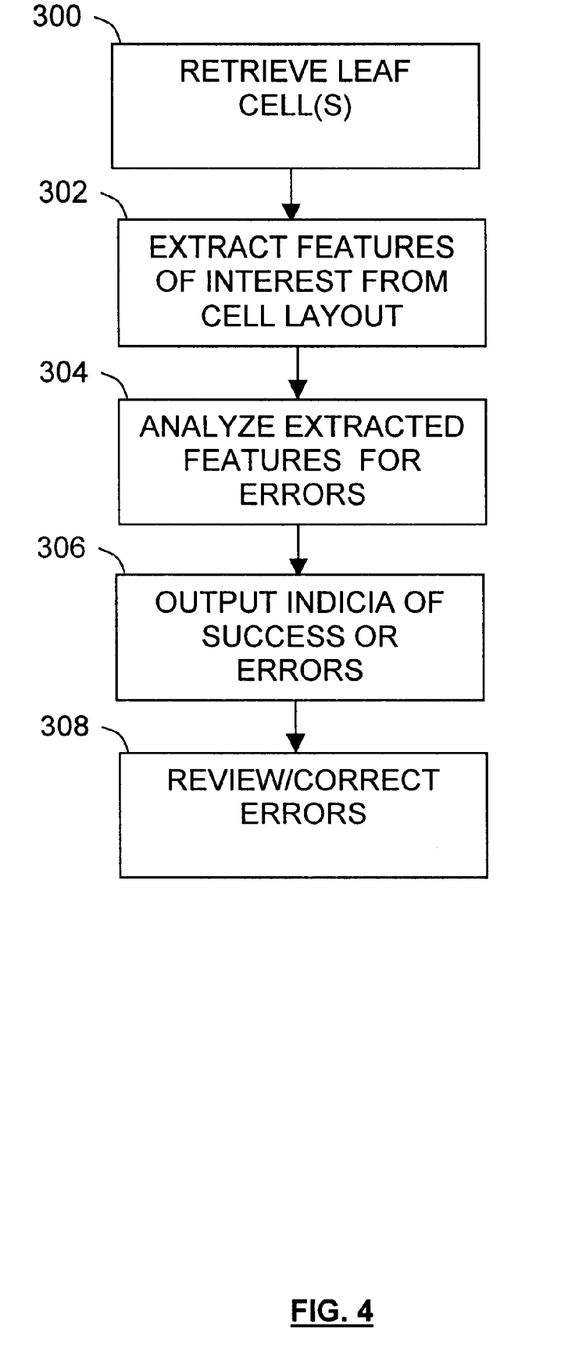
FIG. 4 depicts an embodiment of a method of an audit tool for automatically checking specified leaf cells of the library to determine whether any errors exist, including errors not detected during design rule checking.

In step 136, the processor 12 executes program instructions for the audit tool 40 stored in the memory 24. The audit tool 40 checks specified leaf cells of the library to determine whether any errors exist. An embodiment of the audit method according to the present invention is illustrated in FIG. 4. The audit tool 40 may catch errors in the physical design process that were not detected during the design rule checking step 120. Moreover, the audit tool 40 may catch errors inadvertently introduced after design rule checking in step 120.

Referring to FIG. 4, in step 300, the audit tool 40 instructions cause the processor 12 to retrieve one or more leaf cells specified by a designer in a batch file or interactively. In step 302, the processor 12 identifies features of interest within each leaf cell. For example, the audit process may illustratively verify that the place and route boundary of the cell is properly positioned, that there is only one place and route boundary, that pin labels are properly positioned relative to pin shapes, and that the power and ground buses, substrate and well contacts are properly positioned relative to the place and route boundary. Therefore, in step 302, the processor 12 may extract the place and route boundary, power buses, substrate and well shapes, pin shapes and pin labels from the geometric layout. This involves identifying the shape on the place and route manufacturing level.

Identifying the power buses may be more difficult because the power bus is typically on a manufacturing level, such as a level of metallization, that includes many shapes in addition to the power bus. However, the extraction of power buses may be simplified by identifying all of the shapes on the pin level of the power buses and then eliminating shapes whose geometry is different from a predetermined geometry. The predetermined geometry is chosen based on form factor or separation between the power buses. For example, a power bus may have a width that is greater than the width of any other metal that would appear on a metallization or pin level. Therefore, by eliminating from consideration all shapes with a width less than a predetermined width, the power buses are identified. Substrate and well contacts may be identified as shapes on implant manufacturing levels that do not include overlying gates, for example.

After pertinent shapes have been extracted in step 302, then in step 304, the extracted features are analyzed for errors. For example, the geometry and position of each pertinent shape may be analyzed and compared relative to the place and route boundary. For example, the edges of the power buses may be compared with the place and route boundary to verify that the power buses are properly positioned relative to the place and route boundary. In one embodiment of the invention, the power buses are designed to have edges positioned in the center of the place and route boundary. Therefore, power bus shapes extracted in step 302 may be compared with the place and route boundary shape identified in step 302. If there is no intersection between the place and route boundary and one or both of the power buses, then an error has been identified. If an intersection does exist and an edge of the place and route boundary is not situated at the center of the power bus, that would indicate another error condition. In another example, if pin labels appear outside of the corresponding pin shape, then an error has occurred. Additionally in step 304, all shapes may be checked to determine whether they are on valid manufacturing layers. If any shapes are not on valid manufacturing levels, an error condition is set.

In step 306, the processor 12 outputs an indicia of a successful or unsuccessful audit. Typically, the indicia of an unsuccessful audit will include all error conditions identified during the execution of the audit tool 40 program instructions. The processor 12 may output the indicia of the successful or unsuccessful audit to the database 34 and/or to the display 22.

In step 308, the designer may review the indicia output by the audit tool 40 and, if indicative of errors, the designer may edit the appropriate leaf cells to correct the errors. After step 308, step 138 begins. In step 138, the audited leaf cells are loaded into a library of leaf cells that are ready to be used in chip designs.

While specific embodiments of the present invention have been described, it will be understood that changes may be made to those embodiments without departing from the spirit and scope of the invention.

What is claimed is:

1. A method of creating layout for individual cells comprising a cell library conforming to an overall plan, comprising:

provided a set of design parameters corresponding to a cell;

generating a symbolic layout of the cell based on the design parameters;

specifying constraints on the cell according to an overall plan, the plan including a defined physical cell boundary, power bus width and separation;

generating a compacted layout for the cell from the symbolic layout based on the constraints;

generating substrate and well contacts for the compacted layout of the cell; and storing the compacted layout, including the substrate and well contacts, in a database.

2. The method according to claim 1, wherein the substrate and well contacts are added based on a position of the cell boundary in each compacted layout.

3. The method according to claim 1, wherein the substrate and well contacts are added based on a position of the power buses in each compacted layout.

4. The method according to claim 1, wherein the constraints further includes at least one form factor constraint specifying a number of power buses per cell when a form factor of the compacted layout meets at least one predetermined condition.

5. The method according to claim 1, further comprising:

converting the compacted layout for a each cell in the library conforming to the overall plan to a geometric layout for the cell, the geometric layout including shapes defining input and output pins and wires connected to the pins;

identifying, for the geometric layout of each cell, the wires connected to the input pins and the output pins;

designating the wires connected to the pins internal to the cell as weak connections; and storing the weak connection designations in the database.

6. The method according to claim 5, wherein at least some of the cells have a geometric layout that defines at least two input pins for an input connection and at least two output pins for an output connection;

the at least two input pins and at least two output pins being interconnected by separate respective wires; and wherein the weak connection is identified when one or more of the separate respective wires between the at least two input pins and the at least two output pins is weak.

7. The method according to claim 1, further comprising the step of:

auditing at least one cell to identify any errors in the geometric layout.

8. A design automation system for increasing the speed and accuracy of chip design, comprising:

a memory including program instructions comprising a compactor tool and a setup file, the setup file defining constraints on the compactor tool including constraints defining a cell boundary, power bus width and separation;

a design database for storing and retrieving electronic circuit design data, the database including at least one symbolic layout corresponding to at least one leaf cell; and a processor, coupled to the memory and the design database, the processor executing the program instructions of the compactor tool to: read the setup file and the at least one symbolic layout, compact each of the at least one symbolic layout based on the constraints, and store a compacted layout for each of the at least one symbolic layout in the database.

9. The design automation system according to claim 8, wherein:

the memory further comprises program instructions for a post operations tool and the processor executes the program instructions for the post operations tool to: identify at least one shapes within the compacted layout, and automatically add substrate and well contacts to the compacted layout based on a position of the at least one identified shape.

10. The design automation system according to claim 8, wherein the at least one identified shape includes a cell boundary.

11. The design automation system according to claim 8, wherein the at least one identified shape includes power buses.

12. The design automation system according to claim 8, wherein the setup file further comprises at least one form factor constraint specifying a number of power buses per cell when a form factor of the compacted layout meets at least one predetermined condition.

13. The design automation system according to claim 8, wherein the memory further comprises program instructions for a utility and the processor executes the program instructions for the utility to: convert each compacted layout to a geometric layout, the geometric layout including shapes defining input and output pins and wires connected to the pins, identify, for each compacted layout, the wires connected to the pins, designate the wires connected to the pins as weak connections, and store the weak connection designations in the database.

14. The design automation system according to claim 13, wherein the memory further comprises program instructions for an audit program and the processor executes the program instructions for the audit program to audit at least one cell to identify any errors in the geometric layout.

* * * * *